US007796770B2

(12) United States Patent
Reber et al.

(10) Patent No.: US 7,796,770 B2
(45) Date of Patent: Sep. 14, 2010

(54) HEARING AID WITH FREQUENCY CHANNELS

(75) Inventors: Monika Bertges Reber, Berne (CH); Matthias Schefer, Berne (CH)

(73) Assignee: Bernafon AG, Berne (CH)

( * ) Notice: Subject to any disclaimer, the term of this patent is extended or adjusted under 35 U.S.C. 154(b) by 1272 days.

(21) Appl. No.: 11/312,522

(22) Filed: Dec. 21, 2005

(65) Prior Publication Data

US 2006/0159285 A1 Jul. 20, 2006

(30) Foreign Application Priority Data

Dec. 22, 2004 (EP) ................................ 04388094

(51) Int. Cl.
*H04R 25/00* (2006.01)
*H03G 5/00* (2006.01)

(52) U.S. Cl. ......................... 381/320; 381/98; 381/321

(58) Field of Classification Search .................. 381/98, 381/320
See application file for complete search history.

(56) References Cited

U.S. PATENT DOCUMENTS

| | | | | |
|---|---|---|---|---|
| 4,425,481 | A * | 1/1984 | Mansgold et al. | 381/317 |
| 5,604,812 | A * | 2/1997 | Meyer | 381/314 |
| 6,240,192 | B1 * | 5/2001 | Brennan et al. | 381/314 |
| 2003/0012392 | A1 * | 1/2003 | Armstrong | 381/321 |
| 2003/0112987 | A1 | 6/2003 | Nordqvist et al. | |

FOREIGN PATENT DOCUMENTS

WO WO-98/47313 10/1998

* cited by examiner

*Primary Examiner*—Curtis Kuntz
*Assistant Examiner*—Matthew Eason
(74) *Attorney, Agent, or Firm*—Birch, Stewart, Kolasch & Birch, LLP

(57) ABSTRACT

The invention regards a method for sound processing in an audio device wherein an audio signal is provided and the audio signal is frequency shaped according to the need of a user of the audio device and the frequency shaped signal is served at the user in a form perceivable as sound. According to the invention at least two different frequency shaping schemes are available and a choice is made of the frequency shaping scheme to be used.

11 Claims, 4 Drawing Sheets

HEARING AID WITH FREQUENCY CHANNELS

AREA OF THE INVENTION

The invention relates to a hearing aid wherein captured sound is processed in order to provide an output for the hearing impaired which is perceivable as sound, and whereby the processing is arranged to provide frequency shaping according to the need of the hearing impaired user.

BACKGROUND OF THE INVENTION

The hearing aid adjustment to the listening needs of a hearing impaired is traditionally performed in one of the following ways:

a) The signal is split up into a predefined number of frequency bands where each band comprises a frequency sub-range, whereby the attenuation in each frequency sub-range is controlled. This is called the multi-channel approach and n is a fixed number chosen by the manufacturer. The special case when n=1 is called single-channel.

b) The signal is split up in signal analysis path and a signal processing path. Attenuation values are calculated in the analysing path and applied at one single filter in the signal processing path where the input signal gets corrected according to the needs of the user. This is called channelfree processing. The analysis path can be split up in a number of frequency bands but the signal processing path is un-affected by this.

An example of channelfree processing is disclosed in US patent application publication US 2004/0175011 A1, filed Feb. 24, 2004 incorporated herein as reference.

The effect of using different processing schemes and a different number of channels is the subject of the two below articles:

The preferred Number of Channels (one, two, or four) in NAL-NL 1 Prescribed WDRC Device; Gitte Keidser and Frances Grant; ear & hearing 2001, 22, 516-527.

Benefits of linear amplification and multichannel compression for speech comprehension in backgrounds with spectral and temporal dips. Brian Moore et al. JASA 105 (1) January 1999.

The shape of the hearing loss and the sound environment may well influence the number of channels chosen as proposed from G. Keidser et al in Ear & Hearing 2001. For example, it is known that for music a one channel processing is superior to a multi-channel approach. References can be found at: Boothroyd, A., Mulheam, B., Gong, J., & Ostroff, J. 1996. Effects of spectral smearing on phoneme and word recognition are discussed in: J. Acoust. Soc. Am, 100, 1807-1818. Here it is shown that using multiple channels results in spectral smearing. Especially for music spectral smearing is a very annoying side effect of signal processing and should be avoided. The same approach applies to speech-understanding but here comfort of venting or noise impact the channel decision.

It can be learned from the above articles that many hearing impaired people prefer the single channel approach, because this approach gives the best listening comfort. The multi-channel approach has however, the benefit that it gives the user a better understanding of speech in noise.

None of these articles propose to change the number of channels dynamically according to the sound environment or the hearing impairment.

The idea of the invention is to provide a hearing aid, which combines the benefits of the various proposed processing schemes. The channelfree implementation actually allows a switching of the number of analysis path channels in dependency of the user or environment demand. Channelfree refers to the audio signal which is only modified in one filter, the signal itself is not sent through multiple filters as in multi-channel approaches nor is it sent through amplification blocks in a number of frequency ranges. The invention also allows switching between Channelfree and multi-channel. This means that the number of channels can be dynamically chosen in the signal path and/or the analysis path.

SUMMARY OF THE INVENTION

The invention regards a method for sound processing in an audio device, like a hearing aid. According to the invention an audio signal is provided and the audio signal is frequency shaped according to the need of a user of the audio device. This is the basic function of all hearing aids. The audio signal is usually captured by a microphone in the hearing aid, but it could also be delivered by wire or wirelessly to the hearing aid from a remote point. The frequency shaped signal is served at the user in a form perceivable as sound. In regular hearing aids this means that a receiver is provided for sending the sound into the ear of the user, and for middle ear implants or bone anchored hearing aids a vibrator serves a vibrational signal to the user. In other hearing aid devices like cochlear or mid-brain implants the signal is presented as electric potential with reference to nerve tissue. According to the invention the at least two different frequency shaping schemes are available whereby each frequency shaping scheme comprise processing in a predefined number of channels, wherein a choice of the number of channels is made. In usual hearing aids such a choice is not provided and the user has to accept the number of channels provided by the manufacturer. By using the method according to the invention, hearing aids become more flexible, and may better be modified to suit the needs of the user. As mentioned in the claims compression is preferably a part of the signal processing. Hearing aid users need the compression as the dynamic range of the hearing is often reduced in the hearing of hearing aid users. When using compression, some signal processing schemes give more distortion than others. The hearing aid user may benefit from the invention when good sound quality is important by changing to a signal processing scheme with minimal distortion caused by compression.

According to an embodiment of the invention the input signal is divided into n frequency ranges and the n frequency ranges are combined to form m combination signals $r_1$, $r_2, \ldots r_m$ where the gain and/or compression $g_i$ is determined for the signal $r_i$ in each channel and one of the following is performed: a: the signal $r_i$ in each channel is attenuated according to the corresponding gain/compression value, and the m attenuated signals are combined to form the output, b: the attenuation/compression values $g_i$ are used for controlling a filter, whereby the input signal is subject to the filter in order to provide the output. The a and b possibility may be realized in one hearing aid, which would give the user or the dispenser the widest possible choice of signal processing. In this case a choice is to be made between the a and the b possibility. In the a possibility the input signal is split into individual channels or frequency bands, and the signal in each channel is controlled and at last the signals are added to form the output. In the b possibility the input signal is routed through a signal path and an analysis path, where the analysis path is based on an analysis in a number of frequency bands, and where the signal path comprise a dynamic filter for generating the output. The properties of the dynamic filter are controlled from the results of the bands-split analysis in the analysis path. In the a possibility the number of bands in the signal path is controllable, and in the b possibility the number of channels or frequency bands in the analysis path is controllable. In either case the array of signals $r_1, r_2, \ldots, r_m$ are real signals, but in an actual implementation of the invention also a further array of signals $r_{m+1}, \ldots, r_M$ may be generated, however all of these will be void or zero signals. The m is thus chosen in the range [1–M], where M is the maximum number of channels possible with the DSP unit available According to an embodiment of the invention the number of channels m is chosen by the hearing aid user. This leaves the hearing aid user in command to always choose the preferred signal processing in a given situation.

According to another embodiment the number of channels is selected automatically by the audio device. This is an advantage in that the hearing aid user does not have to worry about the setting of the hearing aid. It requires a safe and reliable detection of the auditory environment by the hearing aid.

In a further embodiment the number of channels is chosen as a part of the adaptation of the hearing aid to the user prior to application of the hearing aid. Here the frequency shaping scheme is chosen in advance by the hearing aid dispenser. This choice could be based on the users hearing loss, the vent or other parameters such as lifestyle.

According to a further aspect, the invention comprises an audio device having a microphone for capturing an audio signal, a signal processor and an output device for presenting the audio signal to the user in a form perceivable as sound. Further the signal processor has means for choosing the number of frequency ranges wherein signal processing is performed. The different frequency ranges could be realized either in an analysis path or in a signal path.

In an aspect of the invention an audio device is provided wherein the signal processor comprise a filter-block for dividing the signal into n different frequency ranges $f_1, f_2, \ldots, f_n$ and a combination unit for combining groups of selected ranges from the n frequency ranges to form m combination signals $r_1, r_2, \ldots, r_m$ whereby further a gain and/or compression calculation block is provided for each of the signals $r_1, r_2, \ldots, r_m$ and where a switching unit is provided to effect changes in the number m of, and/or selected frequency ranges in the combination signals $r_1, r_2, \ldots, r_m$.

This allows the audio device to process the audio signal according to two or more different signal processing schemes according to the needs of the user and the frequency ranges wherein the signal is processed or analysed may be freely chosen by the user.

In a further aspect of the audio device an amplifier and/or a compressor is provided for each of the combination signals $r_1, r_2, \ldots, r_m$ wherein attenuation and/or compression of each combination signal according to the gain and/or compression values from the calculation block is performable and further an adder is provided wherein addition of the attenuated and/or compressed signals $s_1, s_2, \ldots, s_m$ are performable to generate an output signal.

In this way the signal presented as output may be treated directly in the frequency ranges specified by the user and this could provide optimum speech understanding of the signal.

In a further aspect of the audio device a controllable filter is provided in the signal path an wherein a filter coefficient calculation block is provided whereby filter coefficients are calculated and routed to the filter such that the filter will attenuate and/or compress the output signal according to the prescribed gain and/or compression values from the calculation block. This allows a thorough analysis of the signal to be performed in the frequency bands specified by the user, but such that the signal path remains un-changed by this. The filter in the signal path will not cause much distortion of the signal if designed in the right way.

Preferably the invention allows a choice to be made between processing the signal in channels and adding the channels for forming the output or processing the signal in an output filter based on values generated in a separate signal analysation path. The invention thus opens a possibility for the user to choose between a signal processing scheme with more or less distortion. When good speech understanding is required a shaping scheme with more (unwanted) distortion could be chosen because this has beneficial effects to speech understanding. When good speech understanding is not required a more comfortable and less distorted signal processing may be chosen.

DESCRIPTION OF A PREFERRED EMBODIMENT

Figure 1:
FIG. 1 is an illustration of hearing aid user situations where the auditory surroundings are relatively quiet.

The following example is based on a hearing aid with 3 programs. Program 1 is adapted to give the best user benefit in quiet surroundings, program 2 is adapted to give the best user benefit when speech in noise is experienced and program 3 is optimized for listening to music. Optimization of the programs includes signal processing features such as frequency gain characteristic; time-constants, dynamic range, noise-reduction, feedback-management, and directionality. In FIG. 1 examples of typical situations where program 1 would be activated, either by the user or automatically: speech in a group or two people talking.

In situations like the ones displayed in FIG. 1 where the listening task is not overly difficult, the user needs a good sound quality combined with reasonable speech understanding. Thus this program will process the sound through one or two frequency channels. One channel is used when the hearing loss is: a flat mild or moderate to severe hearing loss or no vent is required for occlusion relief. Two channels are prescribed for users who have a ski slope hearing loss or where a vent is required. The vent and the environment have high impact on the decision of the number of channels.

The decision on when to apply a vent is based on the hearing loss or on the perceived occlusion.

Figure 2:
FIG. 2 is an illustration of a hearing aid user situation where a lot of noise makes it difficult for the hearing aid user to have conversations.

In FIG. 2 a very difficult hearing situation is illustrated: the party noise situation. Here the best speech understanding should be provided even if the sound quality is not too good. The user or the hearing aid would choose program 2 and apart from the usual optimized frequency response/feature set this program offers the benefit of processing all available frequency channels. This program prioritises understanding over comfort and uses as many channels as required or available.

Figure 3:
FIG. 3 is an illustration of a hearing aid user situation where especially good sound quality is desired.

FIG. 3 shows a situation wherein listening to music, singing or listening to own voice is the task. Here the hearing aid user would choose program 3. In addition to the usual features being optimized for this situation the hearing aid according to the invention is constructed to process the sound in only one channel which ensures the best listening comfort and the best sound quality for music.

There are a number of ways the program selection in the above examples may be performed:

End-user driven by switching between programs each with their number of channels, Automatically based on environment detection For hearing losses where a vent is required it is an advantage to have one channel dedicated to compensate for the gain loss due to the presence of the vent. A ventilation hole in the ear mould or In-The-Ear hearing aid device allows un-processed sound to enter the ear, and also results in sound pressure loss from within the ear at specific frequencies. Special means to compensate for this may be employed in the audio processing in the hearing aid. This could be in the form of a channel as stated above, dedicated for sound processing in this frequency area. In this channel linear signal processing should be employed, as the sounds coming in through the vent are not compressed. But for the other parts of the frequency range, level detectors are active in order to provide compression to compensate for the hearing loss.

In the above example it is shown how the number of channels is related to each program. It is also possible to have the different number of channels selectable irrespective of the chosen or selected program. One possible way is to have the hearing aid select the program automatically, and then leave the choice on the number of channels with the hearing aid user. Also the hearing aid program selection could be controlled by the user and the number of processing channels could be based on automatic selections. The hearing aid user could also be given the option of choosing both the program and the number of channels.

Figure 4:
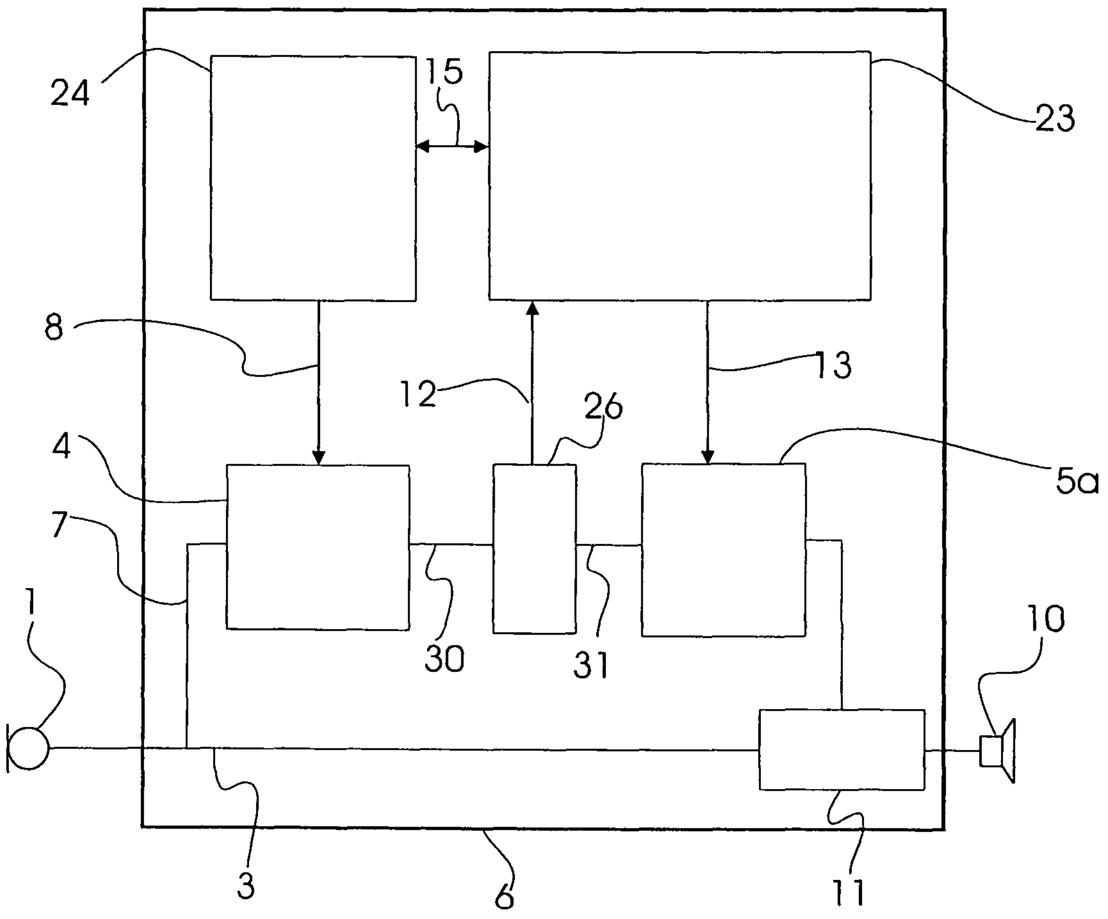
FIG. 4 is a diagram showing the basics of a signal processing scheme according to an example of the invention embodying the channel free possibility.

The situation in FIG. 1 will be characterized by high modulation levels in all bands, and the situation in FIG. 2 by high overall levels plus modulation only at high frequencies. Situations with music will be characterized by the presence of tones and strong harmonics in the frequency spectrum. With reference to FIG. 4, it is understood that based in measurable characteristics of the above kind, commands for controlling the number of channels are easily generated.

In FIG. 4 a schematic representation of the signal processing in a hearing aid according to an example of the invention is shown. The hearing aid comprises a microphone 1 which captures the audio signal and a receiver 10 for presenting a signal to the user perceivable as sound. Between the microphone 1 and the receiver 10 a DSP or digital signal processing unit 6 is provided. DA and AD converters are not shown in the drawing, but will be present as is well known in the art. In the DSP unit 6 a signal path 3 and a signal analysis path 7 are provided. The analysis path 7 comprises a selection module 4 for setting the number of channels. The output 30 from the selection module is a number of signals, each comprising a selected frequency range, and in the following such a selected range will be named a channel. The selection module 4 receives a command signal 8 from a switching unit 24 whereby the number m and range of the channels are set accordingly in the selection module 4. The switching unit 24 exchange information 15 with a command module 23, whereby the chosen number of channels m and their respective ranges is routed to the switching unit 24. The command module 23 receives a variety of input signals: signals from an environment detection part (not shown) of the DSP; possible input from the user, and level and modulation 12 of the signals in the selected channels. This information and possible other key factors are used in an automatic environment detection scheme. Level detector block 26 contains level detectors and as explained the levels detected 12 in the selected number of bands are routed to the command module 23. Based on this information the command module 23 generates two sets of output: a first output 15 with information regarding the optimum number of channels and a second output 13 regarding the preferred gain and/or compression level for each of the chosen channels. The compression settings and gain settings for each of the chosen channels are routed to filter coefficient calculation box 5*a*. The task of setting gain and compression values for each channel are performed according to a usual user fitting of the hearing aid function and automatic or manual choice of program. In filter coefficient calculation box 5*a* the filter coefficients for controlling the filter 11 in the signal path are generated such that when the signal 3 is subject to the filter 11, the output to the receiver 10 will reflect the gain and/or compression settings calculated in box 23.

Figure 5:
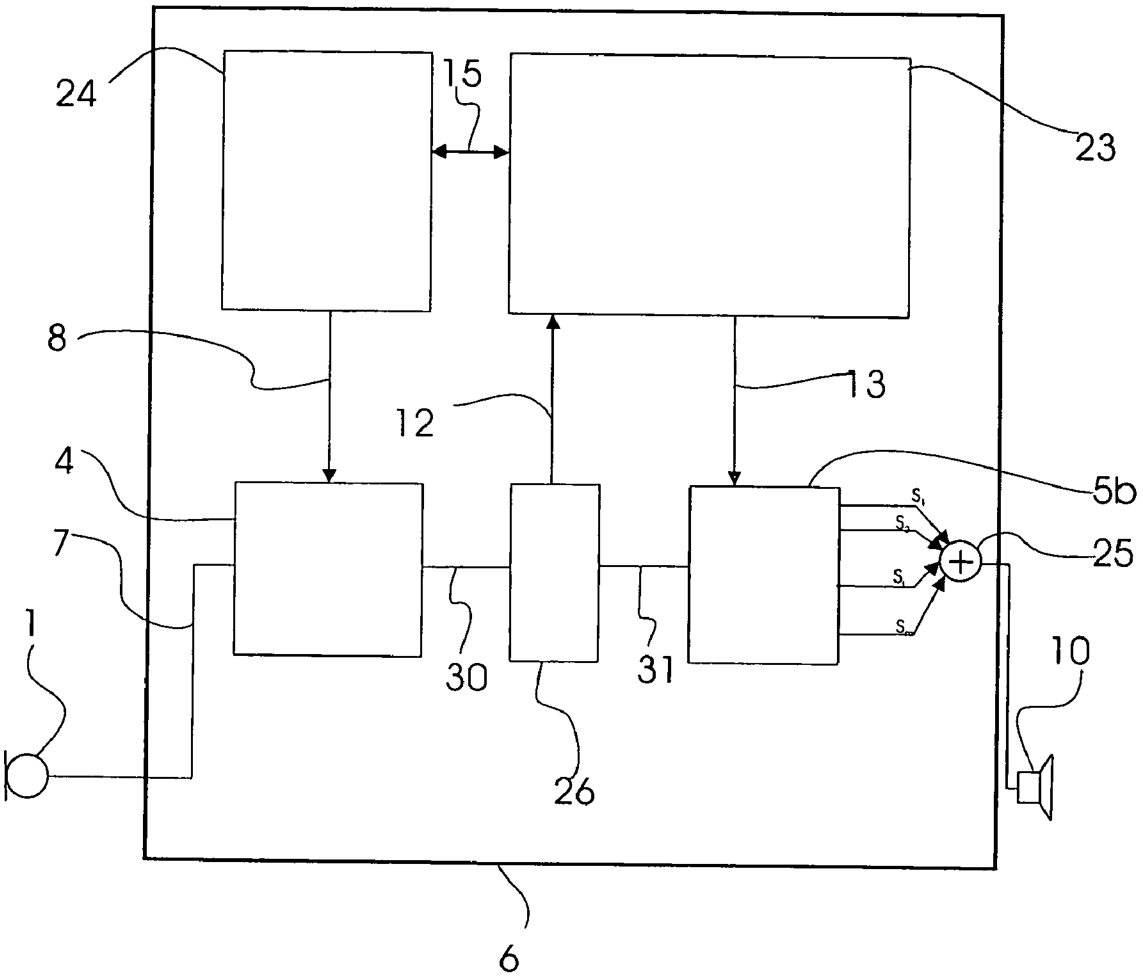
FIG. 5 is a diagram showing the slightly different way of performing the invention than shown in FIG. 4.

In FIG. 5 a diagram is shown with a slightly different implementation than in FIG. 4. Here the path 7 is the signal path, and no output filter is provided. In stead the signal in the selected channels 31 are directly attenuated and/or compressed in an amplifier box 5*b* according to the settings calculated in command box 23. From the amplifier box 5*b* the now attenuated and/or compresses signals $s_1, s_2, \ldots s_m$ are summed in summation unit 25 and fed to the receiver 10.

Figure 6:
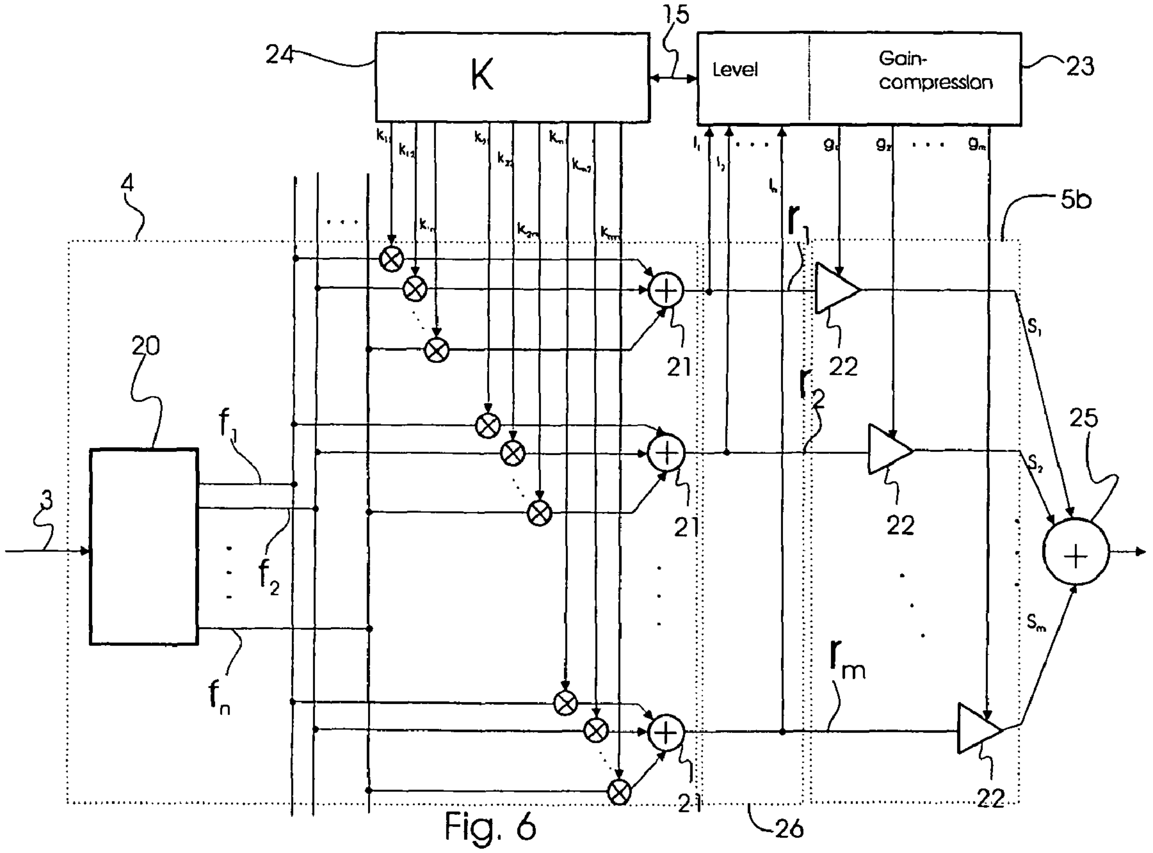
FIG. 6 is a diagram showing the function of the shifting between different numbers of channels.

In FIG. 6 a more detailed example of the selection module 4, a switching unit 24, level detector bloc 26 and amplifier bloc 5*b* are illustrated. In the selection module 4 the incoming signal is split up into n frequency bands $f_1, f_2, \ldots, f_n$ in the filter 20. The frequency bands are multiplied by the channel selection matrix K generated in switching unit 24. K is a matrix of the dimensions M×n. M is the maximum number of channels and m is the chosen number of channels, n is the number of frequency bands of filter 20. The number n is fixed whereas the number m is set in the range between 1 and M. The size of M is dependent on the DSP unit available. The values assigned to the elements of the K matrix are controlled by the command module 23 as seen in FIGS. 4 and 5. For the i'th channel $r_1$ the n frequency bands are multiplied by $[k_{i1}, k_{i2}, \ldots, k_{in}]$ and then added in the summation unit 21. The summation units 21 thus produces M different signals $r_1, r_2, \ldots r_m \ldots r_M$. Each signal $r_i$ thus comprise a group chosen from the frequency ranges $f_1, f_2, \ldots, f_n$. Each frequency f may be represented in one or more of the groups r or a given frequency range $f_x$ may not be represented at all. Also if more frequency ranges f are represented in a group they need not be adjacent one another. Thus any number m of groups of frequency ranges or signals r is possible in theory. In reality the DSP will allow a maximum number M of signals r. By setting the $k_{ij}$ elements of the K matrix right the signals $r_1, r_2, \ldots r_m$ will be real signals and the $r_{m+1} \ldots r_M$ will be void. Please notice that the Figures do not show the $r_{m+1} \ldots r_M$ signals as they for any choice of m will be void. Thus the "K" in box 23 in FIG. 6 only represents that part of k elements $k_{1j}, k_{2j}, \ldots, k_{mj}$, where j ranges from 1 to n whereby non zero channels are being defined. In this example the void and non void channels are grouped such that the $r_1$ to $r_m$ channels are non-zero channels and the $r_{m+1}$ to $r_M$ channels are void, however the void and non-void channels need not be grouped in this way on the actual DSP. As seen the m signals $r_1, r_2, \ldots, r_m$ are routed to block 26 where the signal level $1_1, 1_2, \ldots, 1_m$ of each channel is determined. Possibly also the block 26 may hold level detectors for the $r_{m+1}$ to $r_M$ channels but they will not be activated before another value for m is chosen. Hereafter the channel signals are routed to box 5 for gain/compression setting. In block 26 the signal level 1 of each signal r is determined and based thereon and the program for gain/compression setting chosen, the values for controlling the output are generated. In FIG. 6 the gain/compression values $g_1, g_2, \ldots, g_m$ are routed to an amplifier 22 in amplifier box 5*b* for each signal $r_1, r_2, \ldots, r_m$. After amplification/compression in amplifier units 22 the signals $s_1, s_2, \ldots, s_m$ are summed in summation unit 25 and routed to a receiver as also shown in FIG. 6. Alternatively the amplification compression values are used as displayed in FIG. 5 for controlling filter coefficients for a filter 11 placed in the signal path such that the output signal is generates by feeding the input signal through filter 11.

The switching of the number of channels is controlled by the switching unit 24. This unit determines the multiplication value matrix $K=[(k_{11}, k_{12}, \ldots, k_{1n}), (k_{21}, k_{22}, \ldots, k_{2n}), \ldots, (k_{m1}, k_{m2}, \ldots, k_{mn}), \ldots (k_{M1}, k_{M2}, \ldots, k_{Mn})]$. These values can be dynamically calculated or loaded from the HA memory. As an example, if switching from single channel to m channels, K is changed as follows:

single channel example: each element in $[k_{11}, k_{12}, \ldots, k_{1n}]$ is set to one and all other elements of K=0. Hereby each of the frequency components $f_1, f_2, \ldots, f_n$ are summed at summation point 21 and all other summation points are void.

Multiple channels: In order to have m channels at least one value of the elements $k_{ij}$ is different from zero for each i in the range 1 . . . m, and all elements in the range $[(k_{(m+1)1}, k_{(m+1)2}, \ldots, k_{(m+1),n}), \ldots (k_{M1}, k_{M2}, \ldots, k_{Mn})]$ is set to zero.

The switching is simply performed by changing the value of the $k_{ij}$ elements from the old to the new values. The $k_{ij}$ values can not only be 1 or 0 but may have any value. A smooth transition (fading) can be achieved by slowly changing the k values from the old to the new setting, for example, instead of changing a value immediately from 0 to 1, it is possible to change it to intermediate values before reaching 1. Switching cannot only be done from one to m channels but from x to y channels, where $x,y \in [1 \ldots M]$.

Prior to delivery of the signal to the receiver 10 some sort of further processing may be performed in accordance with the nature of the receiver, but this is not shown, and will be along the usual lines in communication devices. The number n of bands f in filter 20 does not have to be the same as the chosen number of channels m, but it may be the same. It is possible to have more channels than bands by combining for example bands that are not adjacent or by having the same band represented in more than one channel. The maximum available number of channels M is dependent on the properties of the signal processor but this is not limited by theory, so any number of channels is possible within the technical limitations of the DSP unit.

This kind of switching the number of channels can also be used in patent US 2004/0175011 A1 to switch the number of channel in the filter units 1 and 2.

FIG. 6 does not include the input and output transducers or the digital to analog and analog to digital converters that may be present. These parts of the hearing aid are well known and are provided in the usual manner.

In this example the number of level detectors available is equal to the maximum number M of channels, but this does not have to be the case. In the figures only the level detectors for the chosen number of channels m is displayed.

In the example of FIG. 4 the number of channels m is chosen in the analysis path, and in the example of FIG. 5 the number of channels m is chosen in the signal path. Both possibilities may be realized in the same hearing aid. In this case some kind of choice mechanism for choosing between the two options should be implemented in the hearing aid.

The above example is made with respect to a hearing aid, but the invention is usable in other kinds of listening or communication devices such as headsets or telephones. In modern telephones it is common to have audio streaming for entertainment purposes, and here a very good sound quality is wished and a processing as in FIG. 4 may be preferred where the signal path is not split into a number of frequency channels, but when the phone is used for communication a good speech understanding is wished, and here it may be advantageous to employ a processing along the lines of FIG. 5 whereby a better noise-damping and speech enhancement can be provided more precisely, however sacrificing some listening comfort. Also in headset applications especially for garners it is well known that headsets with a good sound quality is in high demand and are often used for listening to music in-between games. Here the gamer may require high amplification in certain frequency ranges of his own choice, where the listening to music requires the best sound quality, and again it could be an advantage to choose between the two options in FIG. 4 and FIG. 5 or to have the possibility to choose the number and possible range of frequency channels in the signal analysis path.

The invention claimed is:

1. A method for sound processing in a hearing aid, comprising:

providing an audio input signal;

selecting a frequency shaping scheme from at least two different shaping schemes, including dynamically choosing a number of channels m through which to process the audio input signal according to a sound environment;

frequency shaping the audio input signal according to a need of a user of the hearing aid and the selected frequency shaping scheme;

serving the frequency shaped signal at the user in a form perceivable as sound.

2. The method as claimed in claim 1, further comprising:

dividing the audio input signal into n frequency ranges $f_1, f_2, \ldots f_n$;

combining groups of the frequency ranges to form m different signals $r_1, r_2, \ldots r_m$;

calculating a gain and/or compression value for each signal r;

attenuating each signal r according to the calculated gain/compression values; and combining the m attenuated signals to form an output.

3. The method as claimed in claim 1, wherein the choice of the number of channels m is made by a user of the hearing aid.

4. The method as claimed in claim 1, wherein the choice of the number of channels is performed automatically by the hearing aid.

5. A hearing aid, comprising:

a microphone for capturing an audio signal;

a signal processor configured to process the audio signal, the signal processor including a selector configured to dynamically select based on a sound environment a number of channels m through which to process the audio signal; and an output device for presenting the audio signal to the user in a form perceivable as sound.

6. The hearing aid as claimed in claim 5, wherein the signal processor further comprises:

a filter-block for dividing the audio signal into n different frequency ranges $f_1, f_2, \ldots, f_n$;

a combination unit for combining groups of selected ranges from the n frequency ranges to form m combination signals $r_1, r_2, \ldots, r_m$;

a gain and/or compression calculation block configured to calculate gain and/or compression values for the combination signals $r_1, r_2, \ldots, r_m$; and a switching unit configured to effect changes in the number m of channels selected by the selector and to effect changes in the selected frequency ranges in the combination signals $r_1, r_2, \ldots, r_m$.

7. The audio device hearing aid as claimed in claim 6, wherein the signal processor further comprises:

an amplifier and/or a compressor provided for each of the combination signals $r_1, r_2, \ldots, r_m$ configured to attenuate and/or compress each combination signal according to the gain and/or compression values to produce attenuated and/or compressed signals $s_1, s_2, \ldots, s_m$; and an adder configured to add the attenuated and/or compressed signals $s_1, s_2, \ldots, s_m$ to generate an output signal.

8. The hearing aid as claimed in claim 6, wherein the signal processor further comprises:

a controllable filter provided in the audio signal path; and a filter coefficient calculation block configured to calculate filter coefficients based on the gain and/or compression values from the calculation block and to route the filter coefficients to the controllable filter, wherein the controllable filter attenuates and/or compresses the audio signal according to the filter coefficients to produce an output signal.

9. The hearing aid as claimed in claim 6, further comprising:

a selection unit configured to select a first signal processing structure or a second signal processing structure, wherein the first signal processing structure includes an amplifier block having an amplifier and/or a compressor for each of the combination signals $r_1, r_2, \ldots, r_m$, the amplifier and/or compressor attenuating and/or compressing each combination signal according to the gain and/or compression values from the calculation block to produce attenuated and/or compressed signals $s_1, s_2, \ldots, s_m$, and an adder configured to add the attenuated and/or compressed signals $s_1, s_2, \ldots, s_m$ to generate an output signal, and wherein the second signal processing structure includes a controllable filter in the audio signal path, and a filter coefficient calculation block configured to calculate filter coefficients based on the gain and/or compression values from the calculation block and to route the filter coefficients to the controllable filter, wherein the controllable filter attenuates and/or compresses the audio signal according to the filter coefficients to produce an output signal.

10. The method as claimed in claim 1, further comprising:

dividing the audio input signal into n frequency ranges $f_1, f_2, \ldots f_n$;

combining groups of the frequency ranges to form m different signals $r_1, r_2, \ldots r_m$;

calculating a gain and/or compression value for each signal r;

controlling a filter based on the calculated attenuation/compression values; and processing the audio input signal through the filter in order to provide an output signal.

11. The method as claimed in claim 1, further comprising:

selecting one of a first process and a second process, wherein the first process includes dividing the audio input signal into n frequency ranges $f_1, f_2, \ldots f_n$, combining groups of the frequency ranges to form m different signals $r_1, r_2, \ldots r_m$, calculating a gain and/or compression value for each signal r, attenuating each signal r according to the calculated gain/compression values, and combining the m attenuated signals to form an output, and wherein the second process includes dividing the audio input signal into n frequency ranges $f_1, f_2, \ldots f_n$, combining groups of the frequency ranges to form m different signals $r_1, r_2, \ldots r_m$, calculating a gain and/or compression value for each signal r, controlling a filter based on the calculated attenuation/compression values, and processing the audio input signal through the filter in to provide an output signal.

* * * * *